(12) United States Patent
Lin et al.

(10) Patent No.: US 9,817,516 B2
(45) Date of Patent: Nov. 14, 2017

(54) GATE DRIVER ON ARRAY CIRCUIT, DISPLAY PANEL AND DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Jian-Hong Lin, Guangdong (CN); Yucheng Tsai, Guangdong (CN); Yaoli Huang, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 132 days.

(21) Appl. No.: 14/905,945

(22) PCT Filed: Oct. 28, 2015

(86) PCT No.: PCT/CN2015/093110
§ 371 (c)(1),
(2) Date: Jan. 18, 2016

(87) PCT Pub. No.: WO2017/063234
PCT Pub. Date: Apr. 20, 2017

(65) Prior Publication Data
US 2017/0235421 A1 Aug. 17, 2017

(30) Foreign Application Priority Data

Oct. 14, 2015 (CN) .......................... 2015 1 0660667

(51) Int. Cl.
*G06F 3/041* (2006.01)
*G09G 3/36* (2006.01)
(Continued)

(52) U.S. Cl.
CPC .......... *G06F 3/0418* (2013.01); *G02F 1/1368* (2013.01); *G02F 1/134309* (2013.01);
(Continued)

(58) Field of Classification Search
CPC ............. G11C 19/287; G09G 2310/08; G09G 2310/0286
See application file for complete search history.

(56) References Cited

U.S. PATENT DOCUMENTS

2004/0141137 A1* 7/2004 Hirabayashi ...... G02F 1/134309
349/149
2012/0001878 A1* 1/2012 Kurokawa ............ G06F 3/0412
345/204

* cited by examiner

*Primary Examiner* — Shaheda Abdin
(74) *Attorney, Agent, or Firm* — Andrew C. Cheng (57) ABSTRACT

The present invention provides a Gate driver on Array circuit, a display panel and a display device. The Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor; and the SR circuit of each stage further comprises: at least one switch, and a G electrode of the switch is inputted with a touch panel scan signal, and a S electrode of the switch is coupled to a K output end, and a D electrode of the switch is coupled to a scan line gate electrode signal of the SR circuit; the K output end inputs a K signal, and the K signal is synchronized with a touch panel signal TP signal.

15 Claims, 6 Drawing Sheets

(51) Int. Cl.
*G02F 1/1368* (2006.01)
*G02F 1/1343* (2006.01)
*G11C 19/28* (2006.01)

(52) U.S. Cl.
CPC ......... *G06F 3/0412* (2013.01); *G09G 3/3677* (2013.01); *G11C 19/287* (2013.01); *G09G 2310/0286* (2013.01); *G09G 2310/08* (2013.01)

GATE DRIVER ON ARRAY CIRCUIT, DISPLAY PANEL AND DISPLAY DEVICE

CROSS REFERENCE

This application claims the priority of Chinese Patent Application No. 201510660667.9, entitled "Gate driver on Array circuit, display panel and display device", filed on Oct. 14, 2015, the disclosure of which is incorporated herein by reference in its entirety.

FIELD OF THE INVENTION

The present invention relates to a display field, and more particularly to a Gate driver on Array circuit, a display panel and a display device.

BACKGROUND OF THE INVENTION

The Touch Screen can allow the user to slightly touch the icon or text on the display panel with fingers for realizing the operation to the host. Then, the physical device (such buttons, mouse) operation can be disappear to make the human machine interaction can be more straightforward. The main application is applied for Public place hall information inquiry, leading office, electronic game, signal request/menu order, multimedia education, ticket purchase, train ticket sale, smart phone, smart television and tablet.

The structure of the touch screen according to prior art will integrate the Gate driver on Array circuit (GOA circuit) on the glass panel of the touch screen. When the touch signal is activated, the scan line and sequence signal (such as CK, XCK) in the panel will cause the extra noise, and thus reduce the Signal to Noise Ratio. Thus the touch control precision of the touch panel display is influenced.

Figure 1:
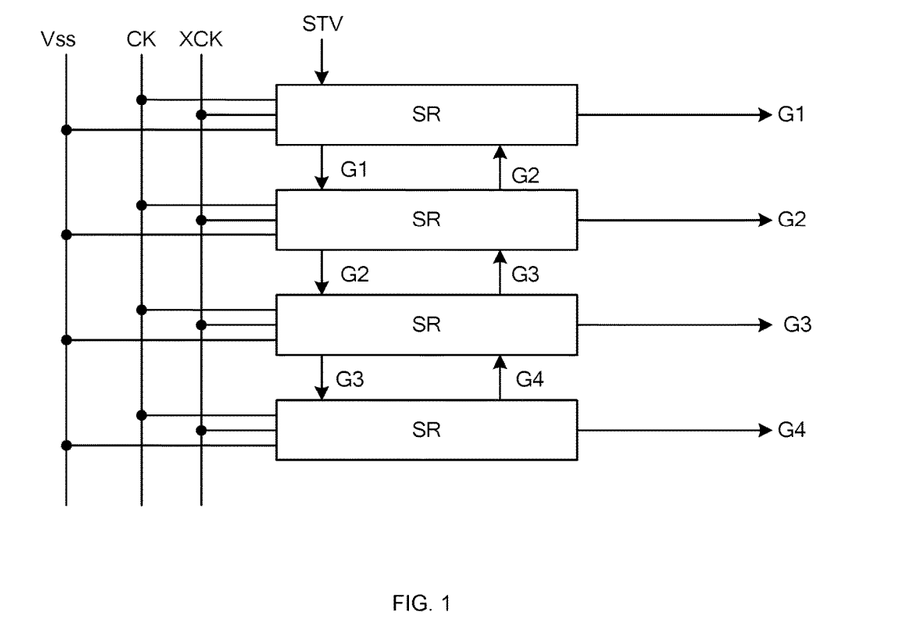
FIG. 1 is a diagram of a GOA circuit and external signals in prior art.
Figure 2:
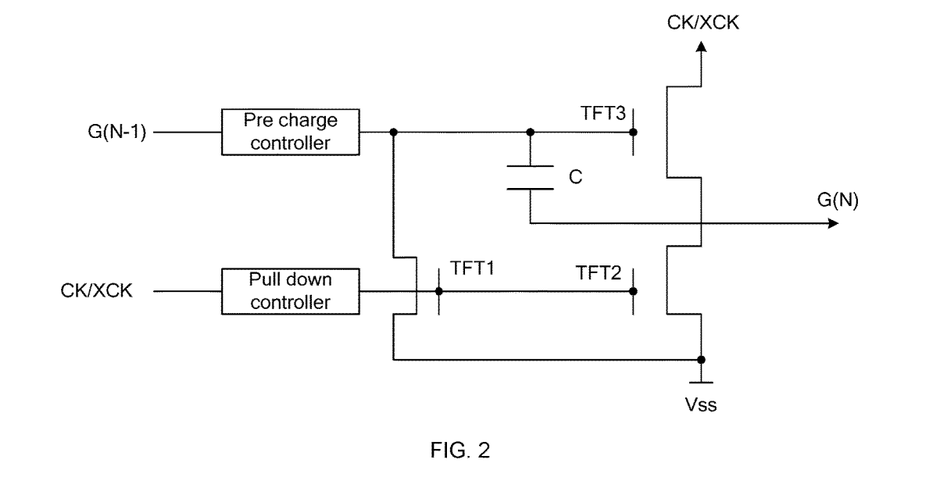
FIG. 2 is a diagram of a SR circuit in prior art.
Figure 3:
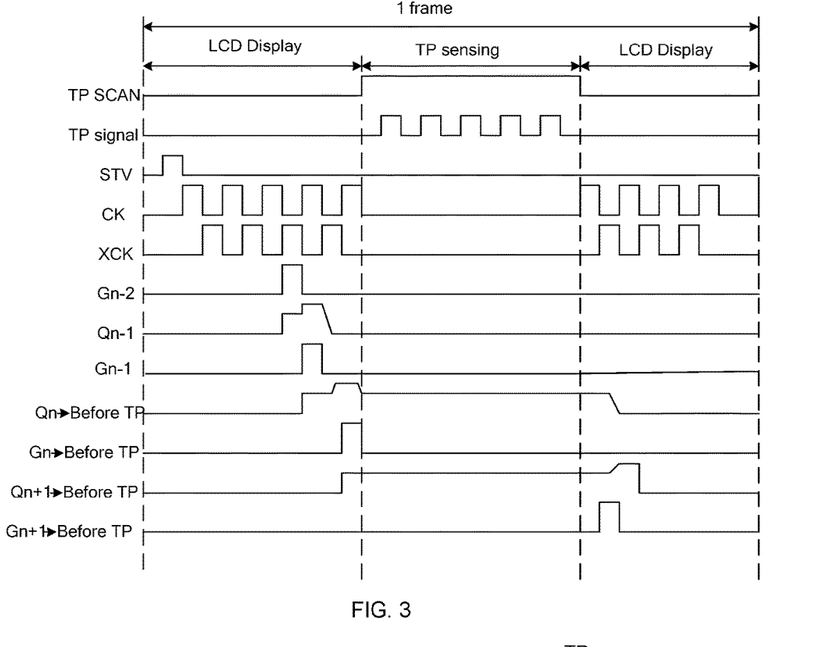
FIG. 3 is a diagram of related signals in FIG. 1, FIG. 2 of prior art.

The detail description to the technical issue of prior art is conducted with combination of the figures. Please refer to FIG. 1, which is a diagram of a GOA circuit and external signals in prior art. The CK, XCK in FIG. 1 can be the sequence signals, and CK and XCK signals are two opposite sequence signals. For convenience, CK can be named to be a first time slot signal, and XCK is named to be a second time slot signal, and VSS can be the power supply negative end of the GOA circuit, and STV can be the start signal of the GOA circuit, and G can be the scan line gate signal of the SR (shift register) circuit; referring to FIG. 2, which is a diagram of a SR circuit in prior art; the SR circuit can comprise a Pre charge controller, a Pull down controller, three TFT (Thin film Transistor) and a capacitor; referring to FIG. 3, which is a diagram of related signals in prior art; in FIG. 3, TP SCAN can be the touch panel scan signal, and in TP SCAN duration, LCD Display can be the display duration of the liquid crystal display (LCD), and in the LCD Display duration, the touch panel detection is not activated, and TP sensing can be touch panel detection duration, and in the touch panel detection duration, the touch panel detection is activated, and Blanking can be an image switch gap, and in the image switch gap duration, the touch panel is not activated; the TP signal can be a touch signal; STV can be the start signal, and Qn can be the Q point signal of the SR circuit; it is obvious in FIG. 3, as the TP SCAN is in the touch panel detection duration and the TP signal detects the touch voltage level, G(n), G(n−1), G(n+1) are not synchronized with the TP signal. Because the aforesaid signal is a synchronization signal, it results in that the signal to noise ratio of the display panel is too low and the touch control precision of the display panel is affected.

SUMMARY OF THE INVENTION

An objective of the present invention is to provide a Gate driver on Array circuit, and the Gate driver on Array circuit synchronizes Gn−1, Gn, Gn+1, TP signal to raise the signal to noise ratio of the display panel utilizing the Gate driver on Array circuit and promote the touch control precision of the display panel.

One, the present invention provides a Gate driver on Array circuit, and the Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor; the SR circuit of each stage further comprises: at least one switch, and a G electrode of the switch is inputted with a touch panel scan TP SCAN signal, and a S electrode of the switch is coupled to a K output end of the signal connection circuit of the shift register SR circuits of multiple stages, and a D electrode of the switch is coupled to a scan line gate electrode signal of the SR circuit; the K output end inputs a K signal, and the K signal is synchronized with a touch panel signal TP signal.

Combining the Gate driver on Array circuit provided by one, in the first selective solution of one, the signal connection circuit of the shift register SR circuits of multiple stages comprises: an external switch set, and the external switch set comprises at least two switches;

the at least two switches comprises a first time slot signal CK switch and a second time slot signal XCK switch; wherein both G electrodes of the CK switch and the XCK switch are inputted with the TP SCAN signals, and both the S electrodes of the CK switch and the XCK switch are inputted with the K signal, and the D electrodes of the CK switch and the XCK switch are respectively inputted with CK and XCK.

Combining the first selective solution of one, in the second selective solution of one, the external switch set further comprises a K signal switch, and a G electrode of the K signal switch is inputted with the TP SCAN signal, and the S electrode of the K signal switch is inputted with the K signal, and a D electrode of the K signal switch is coupled to the K output end.

Combining the first selective solution of one, in the third selective solution of one, the external switch set is integrated on a glass panel of a display panel.

Combining the first selective solution of one, in the fourth selective solution of one, the external switch set is integrated on a glass panel of a display panel.

Combining the Gate driver on Array circuit provided by one, in the fifth selective solution of one, the switch is: a thin film transistor TFT.

Combining the first selective solution of one, in the sixth selective solution of one, the switch is: a thin film transistor TFT.

Two, the present invention provides a display panel, and the display panel comprises: a glass panel and a Gate driver on Array circuit located on the glass panel, and the Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor;

the SR circuit of each stage further comprises: at least one switch, and a G electrode of the switch is inputted with a touch panel scan TP SCAN signal, and a S electrode of the switch is coupled to a K output end of the signal connection circuit of the shift register SR circuits of multiple stages, and a D electrode of the switch is coupled to a scan line gate electrode signal of the SR circuit; the K output end inputs a K signal, and the K signal is synchronized with a touch panel signal TP signal.

Combining the display panel provided by two, in the first selective solution of two, the signal connection circuit of the shift register SR circuits of multiple stages comprises: an external switch set, and the external switch set comprises at least two switches;

the at least two switches comprises a first time slot signal CK switch and a second time slot signal XCK switch; wherein both G electrodes of the CK switch and the XCK switch are inputted with the TP SCAN signals, and both the S electrodes of the CK switch and the XCK switch are inputted with the K signal, and the D electrodes of the CK switch and the XCK switch are respectively inputted with CK and XCK.

Combining the first selective solution of two, in the second selective solution of two, the external switch set further comprises a K signal switch, and a G electrode of the K signal switch is inputted with the TP SCAN signal, and the S electrode of the K signal switch is inputted with the K signal, and a D electrode of the K signal switch is coupled to the K output end.

Combining the first selective solution of two, in the third selective solution of two, the external switch set is integrated on a glass panel of a display panel.

Combining the second selective solution of two, in the fourth selective solution of two, the external switch set is integrated on a glass panel of a display panel.

Combining the display panel provided by two, in the fifth selective solution of two, the switch is: a thin film transistor TFT.

Combining the first selective solution of two, in the fifth selective solution of two, the switch is: a thin film transistor TFT.

Third, the present invention provides a display device, and the display device comprises a display panel, and the display panel comprises: a glass panel and a Gate driver on Array circuit located on the glass panel, and the Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor;

the SR circuit of each stage further comprises: at least one switch, and a G electrode of the switch is inputted with a touch panel scan TP SCAN signal, and a S electrode of the switch is coupled to a K output end of the signal connection circuit of the shift register SR circuits of multiple stages, and a D electrode of the switch is coupled to a scan line gate electrode signal of the SR circuit; the K output end inputs a K signal, and the K signal is synchronized with a touch panel signal TP signal.

Combining the Gate driver on Array circuit provided by three, in the first selective solution of three, the signal connection circuit of the shift register SR circuits of multiple stages comprises: an external switch set, and the external switch set comprises at least two switches;

the at least two switches comprises a first time slot signal CK switch and a second time slot signal XCK switch; wherein both G electrodes of the CK switch and the XCK switch are inputted with the TP SCAN signals, and both the S electrodes of the CK switch and the XCK switch are inputted with the K signal, and the D electrodes of the CK switch and the XCK switch are respectively inputted with CK and XCK.

Combining the first selective solution of three, in the second selective solution of three, the external switch set further comprises a K signal switch, and a G electrode of the K signal switch is inputted with the TP SCAN signal, and the S electrode of the K signal switch is inputted with the K signal, and a D electrode of the K signal switch is coupled to the K output end.

Combining the first selective solution of three, in the third selective solution of three, the external switch set is integrated on a glass panel of a display panel.

Combining the second selective solution of three, in the fourth selective solution of three, the external switch set is integrated on a glass panel of a display panel.

Combining the display device provided by three, in the fifth selective solution of three, the switch is: a thin film transistor TFT.

In the Gate driver on Array circuit, the display panel and the display device provided by the respective embodiments, one switch is added to the SR circuit of each stage, the Gn−1, Gn, Gn+1 and TP signal can synchronized to raise the signal to noise ratio of the touch panel display and promote the touch control precision.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

In figures, if no circle dot exists at the two intersecting full lines, it means that the two intersecting full lines are not electrically coupled. On the contrary, in figures, if a circle dot exists at the two intersecting full lines, it means that the two intersecting full lines are electrically coupled.

Figure 4:
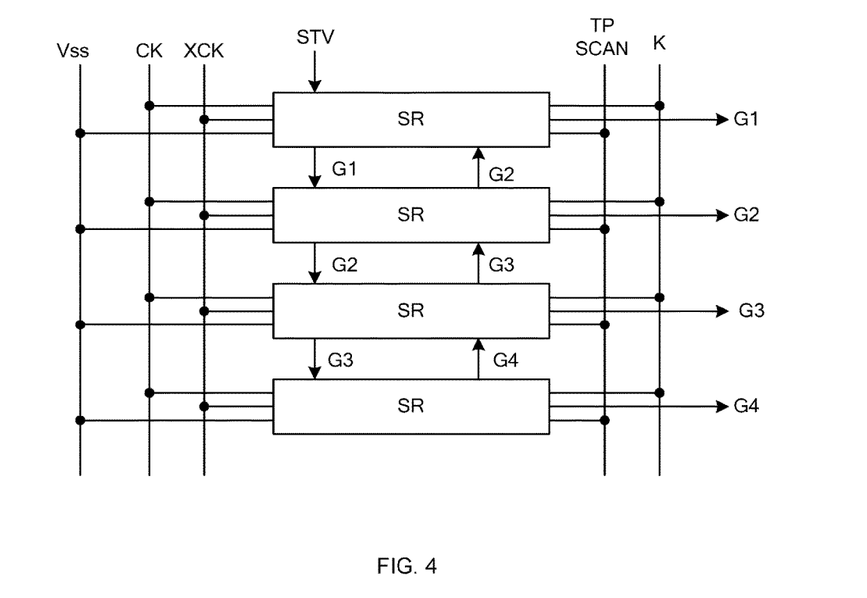
FIG. 4 is a structure diagram of a GOA circuit in the first preferred embodiment of the present invention.

Please refer to FIG. 4, which is a structure diagram of a GOA circuit in the first preferred embodiment of the present invention. Please refer to FIG. 5, which is a structure diagram of a SR circuit in the first preferred embodiment of the present invention. CK, XCK can be sequence signals, and CK and XCK signals are two opposite sequence signals. VSS can be the power supply negative end, and G can be the scan gate line signal of the SR circuit, and STV can be the start signal of the GOA circuit, and TP SCAN can be the touch panel scan signal, and K is the self-defining output end of the first preferred embodiment of the present invention, and the signal inputted by K can be a signal synchronized with the TP signal. For convenience, the signal inputted by the K output end can be named with K signal, and the K signal can be provided by the integrated circuit (IC) of the touch panel display. Certainly in practical application, it can be provided by other device. The embodiment of the present invention does not restrict the specific provider of the aforesaid K signal. In other embodiment, the aforesaid K signal can have other name, such as vgl ripple signal.

Figure 5:
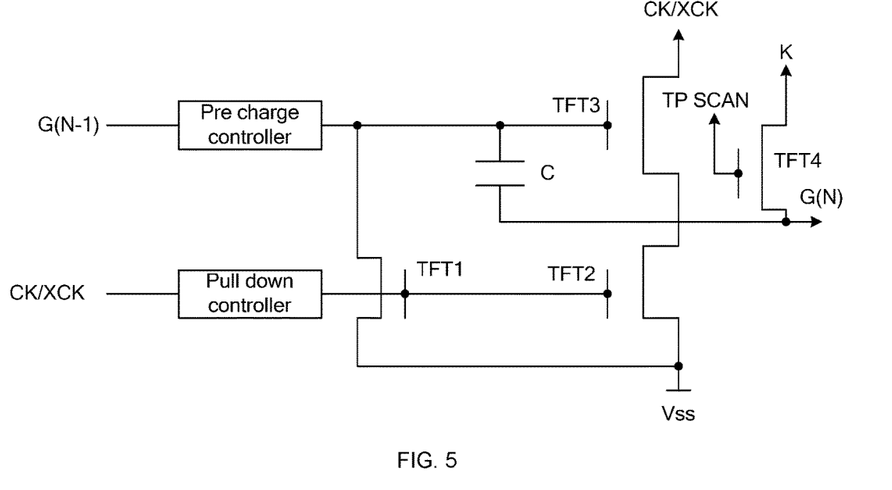
FIG. 5 is a structure diagram of a SR circuit in the first preferred embodiment of the present invention.

As shown in FIG. 4, the GOA circuit comprises shift register SR circuits of multiple stages and a signal connection circuit of the shift register SR circuits of multiple stages. As shown in FIG. 5, the shift register SR circuit of each stage can comprise: a pre-charge controller, three thin film transistors and a capacitor; in the preferred embodiment of the present invention, the SR circuit of each stage further comprises: at least one switch. Addition of one switch is illustrated in FIG. 5. As shown in FIG. 5, the added one switch can be: the fourth TFT (TFT4 shown in FIG. 5); a G (Gate) electrode of the switch is inputted with a TP SCAN signal, and a S (Source) electrode of the switch is coupled to a K output end of the signal connection circuit of the shift register SR circuits of multiple stages, and a D (Drain) electrode of the switch is coupled to G(N), wherein number N of the G(N) can be a natural number larger than or equal to 1.

It is understandable that in the first preferred embodiment of the present invention, the aforesaid switch can be: a TFT. Certainly, in other embodiments, it can be other switch, such as mos switches of other types except the TFT. The specific implement of the present invention does not restrict the particular form of the aforesaid switch, and not limit the particular type number of the aforesaid switch.

Figure 6:
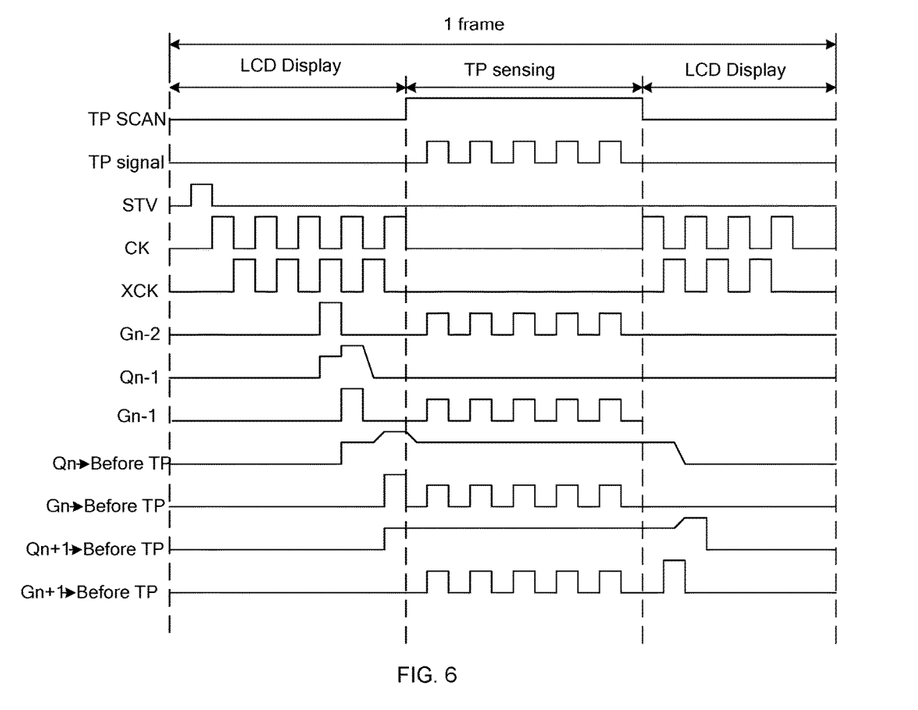
FIG. 6 is a diagram of related signals in the first preferred embodiment of the present invention.

With FIG. 6 and the working principle of the first preferred embodiment of the present invention, the result of the first preferred embodiment of the present invention is explained below. As shown in FIG. 6, FIG. 6 is a diagram of related signals in the first preferred embodiment of the present invention. TP SCAN can be touch panel scan signal. In TP SCAN, LCD Display can be the display duration of the liquid crystal display, and in the LCD Display duration, the touch panel detection is not activated, i.e. TP SCAN is low voltage level, and TP sensing can be touch panel detection duration, and in the touch panel detection duration, the touch panel detection is activated, i.e. TP SCAN is high voltage level, and Blanking can be an image switch gap, and in the image switch gap duration, the touch panel is not activated, i.e. TP SCAN is low voltage level; the TP signal can be a touch signal; Qn can be the Q point signal of the SR circuit, and G(n) can be the scan line gate signal, and one new switch is added to all the SR circuits of respective stages, thus, it is obvious in FIG. 6, as the TP SCAN is in the touch panel detection duration, G(n), G(n-1), G(n+1) are all synchronized with the TP signal. Because the aforesaid signal is a synchronization signal, the noise generated by the CK/XCK signals can be reduced, accordingly to raise the signal to noise ratio of the display panel and promote the touch control precision of the display panel. The working principle of the first preferred embodiment of the present invention can be that with addition of one switch to the SR circuit of each stage, as the G electrode of the switch receives the high voltage level, and activated, the K signal synchronized with the TP signal is inputted into the D electrode through the S electrode, and then to obtain G(N) so that the signal of G(N) and the TP signal are synchronized in the touch panel detection duration. When the G electrode receives the low voltage level, the switch is deactivated. Then, the switch closes the channel between the S electrode and D electrode, and the newly added switch will not work, and no extra effect generates.

Figure 7:
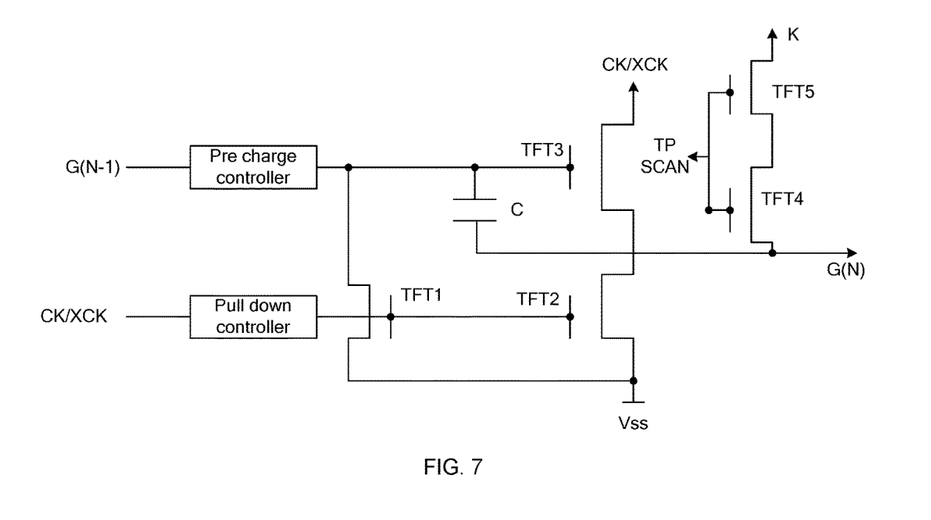
FIG. 7 is a structure diagram of another SR circuit in the first preferred embodiment of the present invention.

Please refer to FIG. 7, which is a structure diagram of a SR circuit in the first preferred embodiment of the present invention. CK, XCK can be sequence signals, and CK and XCK signals are two opposite sequence signals. VSS can be the power supply negative end, and G can be the scan gate line signal of the SR circuit, and STV can be the start signal of the GOA circuit, and TP SCAN can be the touch panel scan signal, and K is the self-defining signal of the first preferred embodiment of the present invention, and the signal inputted by K can be a signal synchronized with the TP signal. The K signal can be provided by the integrated circuit (IC) of the touch panel display. Certainly in practical application, it can be provided by other device. The embodiment of the present invention does not restrict the specific provider of the aforesaid K signal.

As shown in FIG. 7, the shift register SR circuit of each stage can comprise: a pre-charge controller, three thin film transistors and a capacitor; in the preferred embodiment of the present invention, the SR circuit of each stage further comprises at least one switch. As shown in FIG. 7, which is a structure diagram of another SR circuit in the first preferred embodiment of the present invention, addition of two switches is illustrated in FIG. 7. As shown in FIG. 5, the added two switch can be a switch set and the switch set comprises: the fourth TFT (TFT4 shown in FIG. 7) and the fifth TFT (TFT5 shown in FIG. 7); a G (Gate) electrode of the switch set (Here the TFT4 and TFT5 are treated as one unit, and here, it is named as a switch set for being distinguished from the solution of FIG. 5) is inputted with a TP SCAN signal, and a S (Source) electrode of the switch set is inputted with the K signal, and a D (Drain) electrode of the switch set is coupled to G(N), wherein number N of the G(N) can be a natural number larger than or equal to 1. The internal connection of the switch set is shown in FIG. 7. The G electrodes (i.e. the G electrode of the switch set) of TFT4 and TFT5 are inputted with TP SCAN signal, and the D electrode (i.e. the D electrode of the switch set) of TFT4 is coupled to G(N), and the S electrode (i.e. the S electrode of the switch set) of TFT 4 is coupled to the D electrode of TFT5, and the S electrode of TFT 5 is inputted with the K signal. As aforementioned, the at least one switch can be 3 or more than 3 switches. The specific connection can be similar as the connection of 2 switches. The repeated description is omitted here.

With FIG. 6 and the working principle of the switch set in FIG. 7, the result of the first preferred embodiment of the present invention is explained below. As shown in FIG. 6, FIG. 6 is a diagram of related signals in the first preferred embodiment of the present invention. TP SCAN can be touch panel scan signal. In TP SCAN, LCD Display can be the display duration of the liquid crystal display, and in the LCD Display duration, the touch panel detection is not activated, i.e. TP SCAN is low voltage level, and TP sensing can be touch panel detection duration, and in the touch panel detection duration, the touch panel detection is activated, i.e. TP SCAN is high voltage level, and Blanking can be an image switch gap, and in the image switch gap duration, the touch panel is not activated, i.e. TP SCAN is low voltage level; the TP signal can be a touch signal; Qn can be the Q point signal of the SR circuit, and G(n) can be the scan line gate signal, and one new switch is added to all the SR circuits of respective stages, thus, it is obvious in FIG. 6, as the TP SCAN is in the touch panel detection duration, G(n), G(n−1), G(n+1) are all synchronized with the TP signal. Because the aforesaid signal is a synchronization signal, the noise generated by the CK/XCK signals can be reduced, accordingly to raise the signal to noise ratio of the display panel and promote the touch control precision of the display panel. The working principle of the other SR circuit of the first preferred embodiment of the present invention can be that with addition of one switch set, i.e. two switches, to the SR circuit of each stage, for the description, TFT 4 is named to be the first switch, and TFT5 is named to be the second switch. When the G electrode of the first switch and the G electrode of the second switch receive the high voltage level and activated (i.e. TP SCAN are high voltage level), the K signal synchronized with the TP signal is inputted to the D electrode of the second switch through the S electrode of the second switch, and then to the S electrode of the first switch, and then to the D electrode of the first switch, and ultimately the K signal is delivered to G(N), the signal of G(N) is synchronized with the TP signal in the touch panel detection duration. When the G electrode of the first switch and the G electrode of the second electrode receive the low voltage level, the first switch and the second switch are deactivated. Then, the first switch and the second switch close the channels between the S electrodes and D electrodes, and the newly added first switch and second switch will not work, and no extra effect generates. In another SR circuit of the first preferred embodiment of the present invention, the solution shown in FIG. 7 can solve the technical issue of the present invention but the SR circuit of each stage is added with one switch in comparison with the solution shown in FIG. 5. The cost is increased, and the integration level requirement to the GOA circuit is also high.

Figure 8:
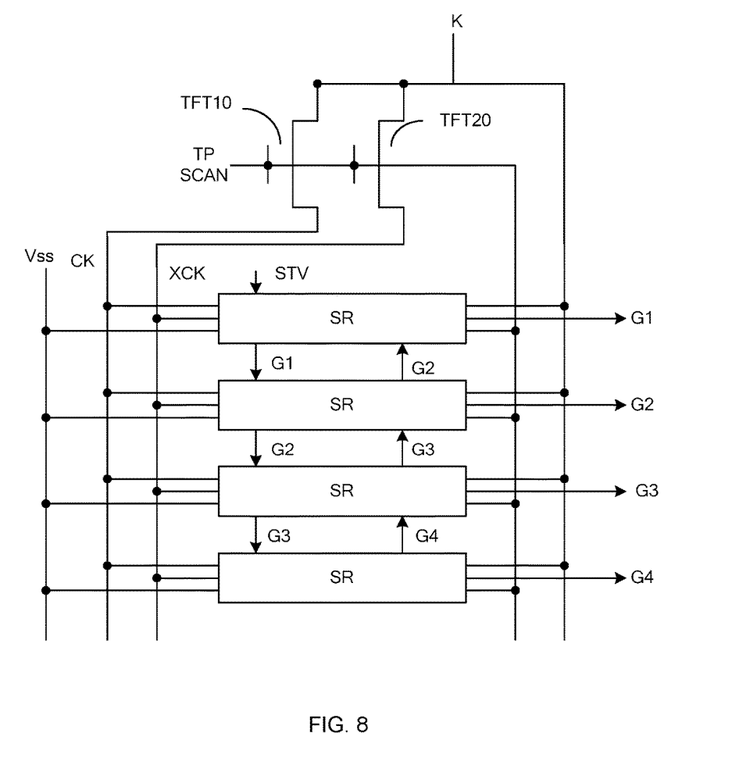
FIG. 8 is a structure diagram of a GOA circuit in the second preferred embodiment of the present invention.

Please refer to FIG. 8, which is a structure diagram of a GOA circuit in the second preferred embodiment of the present invention. Please refer to FIG. 5, which is a structure diagram of a SR circuit in the second preferred embodiment of the present invention. Please refer to FIG. 7, which is a structure diagram of another SR circuit in the second preferred embodiment of the present invention. The technical solutions of FIG. 5 and FIG. 7 have been clearly explained in the first embodiment of the present invention. The repeated description is omitted here.

As shown in FIG. 8, the GOA circuit comprises shift register SR circuits of multiple stages and a signal connection circuit of the shift register SR circuits of multiple stages. As shown in FIG. 5, the shift register SR circuit of each stage can comprise: a pre-charge controller, three thin film transistors and a capacitor; in the preferred embodiment of the present invention, the SR circuit of each stage further comprises: at least one switch and addition of one switch is illustrated in FIG. 5. As shown in FIG. 5, the added one switch can be: the fourth TFT (TFT4 shown in FIG. 5); a G (Gate) electrode of the switch is inputted with a TP SCAN signal, and a S (Source) electrode of the switch is inputted with the K signal, and a D (Drain) electrode of the switch is coupled to G(N), wherein number N of the G(N) can be a natural number larger than or equal to 1. The signal connection circuit of the shift register SR circuits of multiple stages can comprise: a switch set (for being distinguished from the switch set in FIG. 7, the switch set here in FIG. 8 is named to be an external switch set); the external switch set can comprise: at least two switch set. As show shown in FIG. 8, two switches are illustrated. The two switches respectively can be: CK signal switch (for convenience, the CK signal switch is named to be TFT10) and the XCK signal switch (for convenience, the XCK signal switch is named to be TFT20); the S (Source) electrodes of TFT10 and TFT20 are inputted with the signal (i.e. the K signal, certainly in practical application, the signal synchronized with the TP signal can be renamed, for example, the name of the signal synchronized with the TP signal is amended to be vgl ripple signal) synchronized with the TP signal; the G (Gate) electrodes of TFT10 and TFT20 are inputted with TP SCAN signal, and the D (Drain) electrodes of TFT10 and TFT20 are respectively inputted with CK and XCK.

Figure 9:
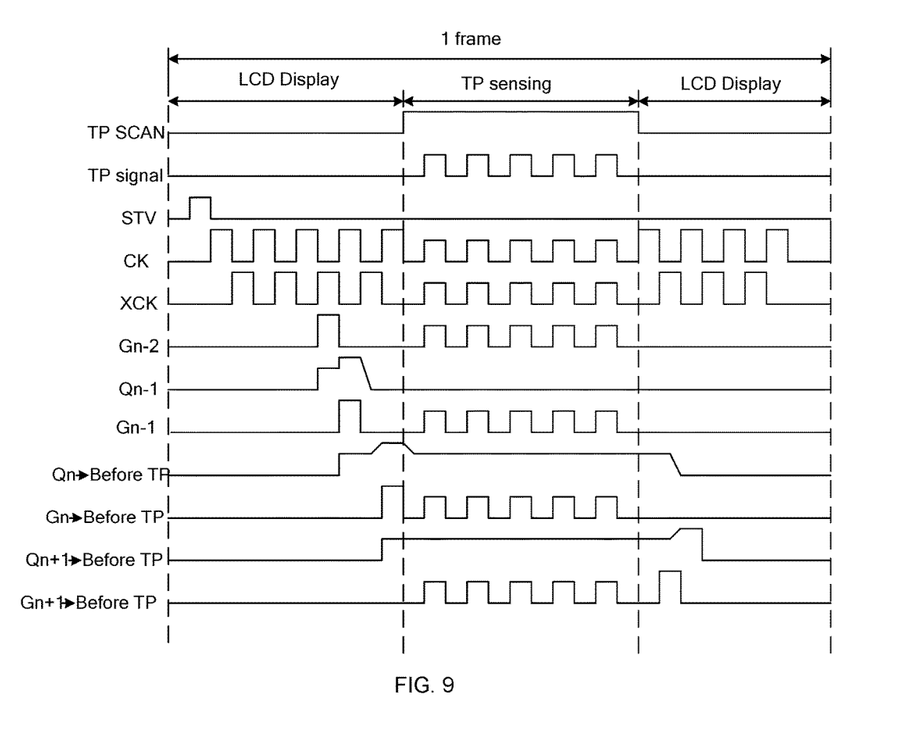
FIG. 9 is a diagram of related signals in the second preferred embodiment of the present invention.

With FIG. 9 and the working principle of the second preferred embodiment of the present invention, the result of the second preferred embodiment of the present invention is explained below. As shown in FIG. 9, FIG. 9 is a diagram of related signals in the first preferred embodiment of the present invention. TP SCAN can be touch panel scan signal. In TP SCAN, LCD Display can be the display duration of the liquid crystal display, and in the LCD Display duration, the touch panel detection is not activated, i.e. TP SCAN is low voltage level, and TP sensing can be touch panel detection duration, and in the touch panel detection duration, the touch panel detection is activated, i.e. TP SCAN is high voltage level, and Blanking can be an image switch gap, and in the image switch gap duration, the touch panel is not activated, i.e. TP SCAN is low voltage level; the TP signal can be a touch signal; Qn can be the Q point signal of the SR circuit, and G(n) can be the scan line gate signal, and CK, XCK can be the sequence signals, and one new switch is added to all the SR circuits of respective stages, thus, it is obvious in FIG. 9, as the TP SCAN is in the touch panel detection duration, G(n), G(n−1), G(n+1) are all synchronized with the TP signal, and CK, XCK are also synchronized with the TP signal. Because the aforesaid signal is a synchronization signal. Thus, it reduces the noise generated by the CK/XCK signals in advance, and further raises the signal to noise ratio of the touch panel display and promote the touch control precision of display panel.

The working principle of the second preferred embodiment of the present invention can be that with addition of the external switch set to the signal connection circuit of the shift register SR circuits of multiple stages, as the G electrode of the external switch set receives the high voltage level, and activated, the signal synchronized with the TP signal is inputted into the D electrode through the S electrode of the external switch set, and then to CK and XCK, and the signal of CK and XCK are synchronized with the TP signal in the touch panel detection duration. When the G electrode of the external switch set receives the low voltage level, the external switch set is deactivated. Then, the external switch set closes the channel between the S electrode and D electrode, and the newly added external switch set will not work, and no extra effect generates.

Figure 10:
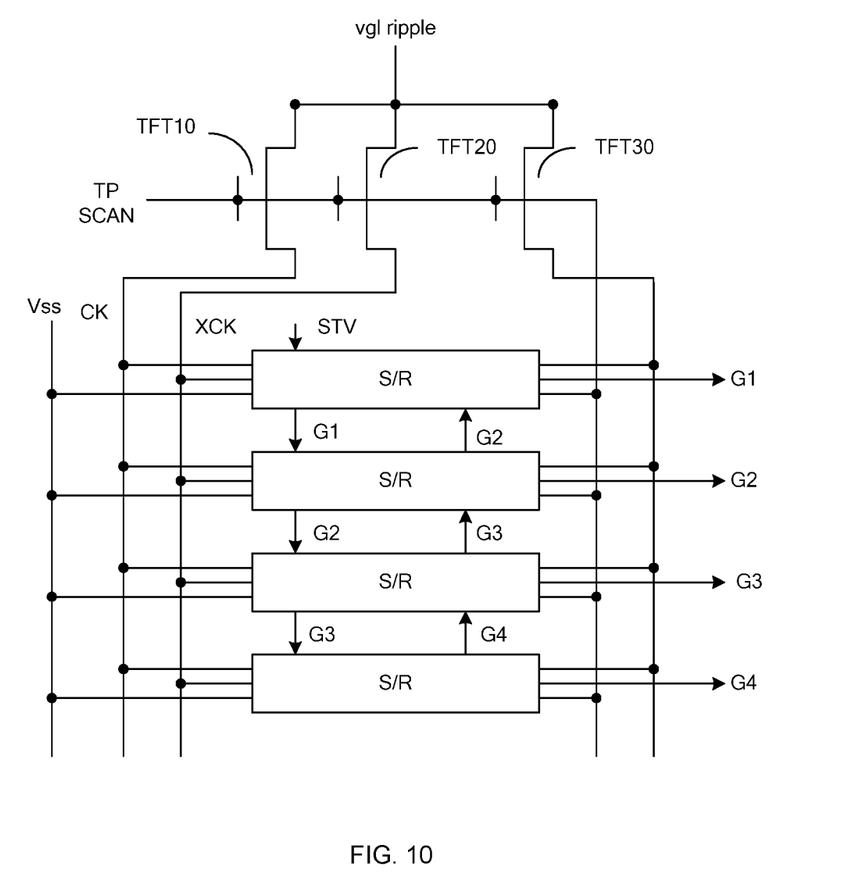
FIG. 10 is a structure diagram of a GOA circuit in the third preferred embodiment of the present invention.

Please refer to FIG. 10. The second switch set in the second embodiment of the present invention can comprise: three switches, and the three switches can respectively be: the CK signal switch, the XCK signal switch and the K signal switch. Because the connections of the CK signal switch, the XCK signal switch are both the same as the technical solution of FIG. 8. The repeated description is omitted here. The G electrode of the K signal switch is inputted with the TP SCAN signal, and the D electrode of the K signal switch is coupled to the K output end, and the S electrode of the K signal switch is inputted with the K signal.

In the second preferred embodiment of the present invention, the CK signal switch, the XCK signal switch and the K signal switch in the second switch set also can comprise a plurality of switches. The combination and connection can be similar as the switched shown in FIG. 7. The repeated description is omitted here.

Preferably, in the second embodiment of the present invention, the aforesaid external switch set is integrated on the glass panel of the touch panel display. Certainly, in other embodiment, it can be possible for the external switch set to not to be integrated on the glass panel but on the other elements of the display panel. When the aforesaid external switch set is integrated on the glass panel of the touch panel display, it can effectively reduce the cost of the display panel.

Besides, the present invention further provides a display panel. The display panel comprises a glass panel and a GOA circuit located on the glass panel.

Please refer to FIG. 4, which is a structure diagram of a GOA circuit in the first preferred embodiment of the present invention. Please refer to FIG. 5, which is a structure diagram of a SR circuit in the first preferred embodiment of the present invention. CK, XCK can be sequence signals, and CK and XCK signals are two opposite sequence signals. VSS can be the power supply negative end, and G can be the scan gate line signal of the SR circuit, and STV can be the start signal of the GOA circuit, and TP SCAN can be the touch panel scan signal, and K is the self-defining output end of the first preferred embodiment of the present invention, and the signal inputted by K can be a signal synchronized with the TP signal. For convenience, the signal inputted by the K output end can be named with K signal, and the K signal can be provided by the integrated circuit (IC) of the touch panel display. Certainly in practical application, it can be provided by other device. The embodiment of the present invention does not restrict the specific provider of the aforesaid K signal. In other embodiment, the aforesaid K signal can have other name, such as vgl ripple signal.

As shown in FIG. 4, the GOA circuit comprises shift register SR circuits of multiple stages and a signal connection circuit of the shift register SR circuits of multiple stages. As shown in FIG. 5, the shift register SR circuit of each stage can comprise: a pre-charge controller, three thin film transistors and a capacitor; in the preferred embodiment of the present invention, the SR circuit of each stage further comprises: at least one switch. Addition of one switch is illustrated in FIG. 5. As shown in FIG. 5, the added one switch can be: the fourth TFT (TFT4 shown in FIG. 5); a G (Gate) electrode of the switch is inputted with a TP SCAN signal, and a S (Source) electrode of the switch is coupled to a K output end of the signal connection circuit of the shift register SR circuits of multiple stages, and a D (Drain) electrode of the switch is coupled to G(N), wherein number N of the G(N) can be a natural number larger than or equal to 1.

It is understandable that in the first preferred embodiment of the present invention, the aforesaid switch can be: a TFT. Certainly, in other embodiments, it can be other switch, such as mos switches of other types except the TFT. The specific implement of the present invention does not restrict the particular form of the aforesaid switch, and not limit the particular type number of the aforesaid switch.

With FIG. 6 and the working principle of the first preferred embodiment of the present invention, the result of the first preferred embodiment of the present invention is explained below. As shown in FIG. 6, FIG. 6 is a diagram of related signals in the first preferred embodiment of the present invention. TP SCAN can be touch panel scan signal. In TP SCAN, LCD Display can be the display duration of the liquid crystal display, and in the LCD Display duration, the touch panel detection is not activated, i.e. TP SCAN is low voltage level, and TP sensing can be touch panel detection duration, and in the touch panel detection duration, the touch panel detection is activated, i.e. TP SCAN is high voltage level, and Blanking can be an image switch gap, and in the image switch gap duration, the touch panel is not activated, i.e. TP SCAN is low voltage level; the TP signal can be a touch signal; Qn can be the Q point signal of the SR circuit, and G(n) can be the scan line gate signal, and one new switch is added to all the SR circuits of respective stages, thus, it is obvious in FIG. 6, as the TP SCAN is in the touch panel detection duration, G(n), G(n−1), G(n+1) are all synchronized with the TP signal. Because the aforesaid signal is a synchronization signal, the noise generated by the CK/XCK signals can be reduced, accordingly to raise the signal to noise ratio of the display panel and promote the touch control precision of the display panel. The working principle of the first preferred embodiment of the present invention can be that with addition of one switch to the SR circuit of each stage, as the G electrode of the switch receives the high voltage level, and activated, the K signal synchronized with the TP signal is inputted into the D electrode through the S electrode, and then to obtain G(N) so that the signal of G(N) and the TP signal are synchronized in the touch panel detection duration. When the G electrode receives the low voltage level, the switch is deactivated. Then, the switch closes the channel between the S electrode and D electrode, and the newly added switch will not work, and no extra effect generates.

Please refer to FIG. 7, which is a structure diagram of a SR circuit in the first preferred embodiment of the present invention. CK, XCK can be sequence signals, and CK and XCK signals are two opposite sequence signals. VSS can be the power supply negative end, and G can be the scan gate line signal of the SR circuit, and STV can be the start signal of the GOA circuit, and TP SCAN can be the touch panel scan signal, and K is the self-defining signal of the first preferred embodiment of the present invention, and the signal inputted by K can be a signal synchronized with the TP signal. The K signal can be provided by the integrated circuit (IC) of the touch panel display. Certainly in practical application, it can be provided by other device. The embodiment of the present invention does not restrict the specific provider of the aforesaid K signal.

As shown in FIG. 7, the shift register SR circuit of each stage can comprise: a pre-charge controller, three thin film transistors and a capacitor; in the preferred embodiment of the present invention, the SR circuit of each stage further comprises at least one switch. As shown in FIG. 7, which is a structure diagram of another SR circuit in the first preferred embodiment of the present invention, addition of two switches is illustrated in FIG. 7. As shown in FIG. 5, the added two switch can be a switch set and the switch set comprises: the fourth TFT (TFT4 shown in FIG. 7) and the fifth TFT (TFT5 shown in FIG. 7); a G (Gate) electrode of the switch set (Here the TFT4 and TFT5 are treated as one unit, and here, it is named as a switch set for being distinguished from the solution of FIG. 5) is inputted with a TP SCAN signal, and a S (Source) electrode of the switch set is inputted with the K signal, and a D (Drain) electrode of the switch set is coupled to G(N), wherein number N of the G(N) can be a natural number larger than or equal to 1. The internal connection of the switch set is shown in FIG. 7. The G electrodes (i.e. the G electrode of the switch set) of TFT4 and TFT5 are inputted with TP SCAN signal, and the D electrode (i.e. the D electrode of the switch set) of TFT4 is coupled to G(N), and the S electrode (i.e. the S electrode of the switch set) of TFT 4 is coupled to the D electrode of TFT5, and the S electrode of TFT 5 is inputted with the K signal. As aforementioned, the at least one switch can be 3 or more than 3 switches. The specific connection can be similar as the connection of 2 switches. The repeated description is omitted here.

With FIG. 6 and the working principle of the switch set in FIG. 7, the result of the first preferred embodiment of the present invention is explained below. As shown in FIG. 6, FIG. 6 is a diagram of related signals in the first preferred embodiment of the present invention. TP SCAN can be touch panel scan signal. In TP SCAN, LCD Display can be the display duration of the liquid crystal display, and in the LCD Display duration, the touch panel detection is not activated, i.e. TP SCAN is low voltage level, and TP sensing can be touch panel detection duration, and in the touch panel detection duration, the touch panel detection is activated, i.e. TP SCAN is high voltage level, and Blanking can be an image switch gap, and in the image switch gap duration, the touch panel is not activated, i.e. TP SCAN is low voltage level; the TP signal can be a touch signal; Qn can be the Q point signal of the SR circuit, and G(n) can be the scan line gate signal, and one new switch is added to all the SR circuits of respective stages, thus, it is obvious in FIG. 6, as the TP SCAN is in the touch panel detection duration, G(n), G(n−1), G(n+1) are all synchronized with the TP signal. Because the aforesaid signal is a synchronization signal, the noise generated by the CK/XCK signals can be reduced, accordingly to raise the signal to noise ratio of the display panel and promote the touch control precision of the display panel. The working principle of the other SR circuit of the first preferred embodiment of the present invention can be that with addition of one switch set, i.e. two switches, to the SR circuit of each stage, for the description, TFT 4 is named to be the first switch, and TFT5 is named to be the second switch. When the G electrode of the first switch and the G electrode of the second switch receive the high voltage level and activated (i.e. TP SCAN are high voltage level), the K signal synchronized with the TP signal is inputted to the D electrode of the second switch through the S electrode of the second switch, and then to the S electrode of the first switch, and then to the D electrode of the first switch, and ultimately the K signal is delivered to G(N), the signal of G(N) is synchronized with the TP signal in the touch panel detection duration. When the G electrode of the first switch and the G electrode of the second electrode receive the low voltage level, the first switch and the second switch are deactivated. Then, the first switch and the second switch close the channels between the S electrodes and D electrodes, and the newly added first switch and second switch will not work, and no extra effect generates. In another SR circuit of the first preferred embodiment of the present invention, the solution shown in FIG. 7 can solve the technical issue of the present invention but the SR circuit of each stage is added with one switch in comparison with the solution shown in FIG. 5. The cost is increased, and the integration level requirement to the GOA circuit is also high.

Please refer to FIG. 8, which is a structure diagram of a GOA circuit in the second preferred embodiment of the present invention. Please refer to FIG. 5, which is a structure diagram of a SR circuit in the second preferred embodiment of the present invention. Please refer to FIG. 7, which is a structure diagram of another SR circuit in the second preferred embodiment of the present invention. The technical solutions of FIG. 5 and FIG. 7 have been clearly explained in the first embodiment of the present invention. The repeated description is omitted here.

As shown in FIG. 8, the GOA circuit comprises shift register SR circuits of multiple stages and a signal connection circuit of the shift register SR circuits of multiple stages. As shown in FIG. 5, the shift register SR circuit of each stage can comprise: a pre-charge controller, three thin film transistors and a capacitor; in the preferred embodiment of the present invention, the SR circuit of each stage further comprises: at least one switch and addition of one switch is illustrated in FIG. 5. As shown in FIG. 5, the added one switch can be: the fourth TFT (TFT4 shown in FIG. 5); a G (Gate) electrode of the switch is inputted with a TP SCAN signal, and a S (Source) electrode of the switch is inputted with the K signal, and a D (Drain) electrode of the switch is coupled to G(N), wherein number N of the G(N) can be a natural number larger than or equal to 1. The signal connection circuit of the shift register SR circuits of multiple stages can comprise: a switch set (for being distinguished from the switch set in FIG. 7, the switch set here in FIG. 8 is named to be an external switch set); the external switch set can comprise: at least two switch set. As show shown in FIG. 8, two switches are illustrated. The two switches respectively can be: CK signal switch (for convenience, the CK signal switch is named to be TFT10) and the XCK signal switch (for convenience, the XCK signal switch is named to be TFT20); the S (Source) electrodes of TFT10 and TFT20 are inputted with the signal (i.e. the K signal, certainly in practical application, the signal synchronized with the TP signal can be renamed, for example, the name of the signal synchronized with the TP signal is amended to be vgl ripple signal) synchronized with the TP signal; the G (Gate) electrodes of TFT10 and TFT20 are inputted with TP SCAN signal, and the D (Drain) electrodes of TFT10 and TFT20 are respectively inputted with CK and XCK.

With FIG. 9 and the working principle of the second preferred embodiment of the present invention, the result of the second preferred embodiment of the present invention is explained below. As shown in FIG. 9, FIG. 9 is a diagram of related signals in the first preferred embodiment of the present invention. TP SCAN can be touch panel scan signal. In TP SCAN, LCD Display can be the display duration of the liquid crystal display, and in the LCD Display duration, the touch panel detection is not activated, i.e. TP SCAN is low voltage level, and TP sensing can be touch panel detection duration, and in the touch panel detection duration, the touch panel detection is activated, i.e. TP SCAN is high voltage level, and Blanking can be an image switch gap, and in the image switch gap duration, the touch panel is not activated, i.e. TP SCAN is low voltage level; the TP signal can be a touch signal; Qn can be the Q point signal of the SR circuit, and G(n) can be the scan line gate signal, and CK, XCK can be the sequence signals, and one new switch is added to all the SR circuits of respective stages, thus, it is obvious in FIG. 9, as the TP SCAN is in the touch panel detection duration, G(n), G(n−1), G(n+1) are all synchronized with the TP signal, and CK, XCK are also synchronized with the TP signal. Because the aforesaid signal is a synchronization signal. Thus, it reduces the noise generated by the CK/XCK signals in advance, and further raises the signal to noise ratio of the touch panel display and promote the touch control precision of display panel.

The working principle of the second preferred embodiment of the present invention can be that with addition of the external switch set to the signal connection circuit of the shift register SR circuits of multiple stages, as the G electrode of the external switch set receives the high voltage level, and activated, the signal synchronized with the TP signal is inputted into the D electrode through the S electrode of the external switch set, and then to CK and XCK, and the signal of CK and XCK are synchronized with the TP signal in the touch panel detection duration. When the G electrode of the external switch set receives the low voltage level, the external switch set is deactivated. Then, the external switch set closes the channel between the S electrode and D electrode, and the newly added external switch set will not work, and no extra effect generates.

Please refer to FIG. 10. The second switch set in the second embodiment of the present invention can comprise: three switches, and the three switches can respectively be: the CK signal switch, the XCK signal switch and the K signal switch. Because the connections of the CK signal switch, the XCK signal switch are both the same as the technical solution of FIG. 8. The repeated description is omitted here. The G electrode of the K signal switch is inputted with the TP SCAN signal, and the D electrode of the K signal switch is coupled to the K output end, and the S electrode of the K signal switch is inputted with the K signal.

In the second preferred embodiment of the present invention, the CK signal switch, the XCK signal switch and the K signal switch in the second switch set also can comprise a plurality of switches. The combination and connection can be similar as the switched shown in FIG. 7. The repeated description is omitted here.

Preferably, in the second embodiment of the present invention, the aforesaid external switch set is integrated on the glass panel of the touch panel display. Certainly, in other embodiment, it can be possible for the external switch set to not to be integrated on the glass panel but on the other elements of the display panel. When the aforesaid external switch set is integrated on the glass panel of the touch panel display, it can effectively reduce the cost of the display panel.

Besides, the present invention further provides a display device, and the display device comprises a display panel, and the aforesaid display panel comprises a glass panel and a GOA circuit located on the glass panel. The specific structure and function of the GOA circuit has already been explained in the aforesaid description. The repeated description is omitted here. The specific form of the foregoing display device can be: the apparatus which can utilizing the display device, such as the television, the cell phone.

Above are embodiments of the present invention, which does not limit the scope of the present invention. Any modifications, equivalent replacements or improvements within the spirit and principles of the embodiment described above should be covered by the protected scope of the invention.

What is claimed is:

1. A Gate driver on Array circuit, and the Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor; wherein, the SR circuit of each stage further comprises: at least one switch, and a G electrode of the switch is inputted with a touch panel scan TP SCAN signal, and a S electrode of the switch is coupled to a K output end of the signal connection circuit of the shift register SR circuits of multiple stages, and a D electrode of the switch is coupled to a scan line gate electrode signal of the SR circuit; the K output end inputs a K signal, and the K signal is synchronized with a touch panel signal TP signal;

wherein the signal connection circuit of the shift register SR circuits of multiple stages comprises: an external switch set, and the external switch set comprises at least two switches;

the at least two switches comprises a first time slot signal CK switch and a second time slot signal XCK switch; wherein both G electrodes of the CK switch and the XCK switch are inputted with the TP SCAN signals, and both the S electrodes of the CK switch and the XCK switch are inputted with the K signal, and the D electrodes of the CK switch and the XCK switch are respectively inputted with CK and XCK.

2. The Gate driver on Array circuit according to claim 1, wherein the external switch set further comprises a K signal switch, and a G electrode of the K signal switch is inputted with the TP SCAN signal, and the S electrode of the K signal switch is inputted with the K signal, and a D electrode of the K signal switch is coupled to the K output end.

3. The Gate driver on Array circuit according to claim 2, wherein the external switch set is integrated on a glass panel of a display panel.

4. The Gate driver on Array circuit according to claim 1, wherein the external switch set is integrated on a glass panel of a display panel.

5. The Gate driver on Array circuit according to claim 1, wherein the switch is: a thin film transistor TFT.

6. A display panel, and the display panel comprises: a glass panel and a Gate driver on Array circuit located on the glass panel, and the Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor; wherein, the SR circuit of each stage further comprises: at least one switch, and a G electrode of the switch is inputted with a touch panel scan TP SCAN signal, and a S electrode of the switch is coupled to a K output end of the signal connection circuit of the shift register SR circuits of multiple stages, and a D electrode of the switch is coupled to a scan line gate electrode signal of the SR circuit; the K output end inputs a K signal, and the K signal is synchronized with a touch panel signal TP signal;

wherein the signal connection circuit of the shift register SR circuits of multiple stages comprises: an external switch set, and the external switch set comprises at least two switches;

the at least two switches comprises a first time slot signal CK switch and a second time slot signal XCK switch;

wherein both G electrodes of the CK switch and the XCK switch are inputted with the TP SCAN signals, and both the S electrodes of the CK switch and the XCK switch are inputted with the K signal, and the D electrodes of the CK switch and the XCK switch are respectively inputted with CK and XCK.

7. The display panel according to claim 6, wherein the external switch set further comprises a K signal switch, and a G electrode of the K signal switch is inputted with the TP SCAN signal, and the S electrode of the K signal switch is inputted with the K signal, and a D electrode of the K signal switch is coupled to the K output end.

8. The display panel according to claim 7, wherein the external switch set is integrated on a glass panel of a display panel.

9. The display panel according to claim 6, wherein the switch is: a thin film transistor TFT.

10. The display panel according to claim 6, wherein the external switch set is integrated on a glass panel of a display panel.

11. A display device, and the display device comprises a display panel, and the display panel comprises: a glass panel and a Gate driver on Array circuit located on the glass panel, and the Gate driver on Array circuit comprises: shift register SR circuits of multiple stages and a signal connection circuit of the shift register SR circuits of multiple stages, and the shift register SR circuit of each stage comprises: a pre-charge controller, three thin film transistors and a capacitor; wherein, the SR circuit of each stage further comprises: at least one switch, and a G electrode of the switch is inputted with a touch panel scan TP SCAN signal, and a S electrode of the switch is coupled to a K output end of the signal connection circuit of the shift register SR circuits of multiple stages, and a D electrode of the switch is coupled to a scan line gate electrode signal of the SR circuit; the K output end inputs a K signal, and the K signal is synchronized with a touch panel signal TP signal;

wherein the signal connection circuit of the shift register SR circuits of multiple stages comprises: an external switch set, and the external switch set comprises at least two switches;

the at least two switches comprises a first time slot signal CK switch and a second time slot signal XCK switch; wherein both G electrodes of the CK switch and the XCK switch are inputted with the TP SCAN signals, and both the S electrodes of the CK switch and the XCK switch are inputted with the K signal, and the D electrodes of the CK switch and the XCK switch are respectively inputted with CK and XCK.

12. The display device according to claim 11, wherein the external switch set further comprises a K signal switch, and a G electrode of the K signal switch is inputted with the TP SCAN signal, and the S electrode of the K signal switch is inputted with the K signal, and a D electrode of the K signal switch is coupled to the K output end.

13. The display device according to claim 12, wherein the external switch set is integrated on a glass panel of a display panel.

14. The display device according to claim 11, wherein the external switch set is integrated on a glass panel of a display panel.

15. The display device according to claim 11, wherein the switch is: a thin film transistor TFT.

* * * * *